(12) United States Patent
Yu et al.

(10) Patent No.: US 9,425,300 B2
(45) Date of Patent: Aug. 23, 2016

(54) SEMICONDUCTOR STRUCTURE AND METHOD OF FORMING THE SAME

(71) Applicant: TAIWAN SEMICONDUCTOR MANUFACTURING COMPANY, LTD., Hsinchu (TW)

(72) Inventors: Chen-Ju Yu, Jiaoxi Township (TW); Fu-Wei Yao, Hsinchu (TW); Chun-Wei Hsu, Taichung (TW); Jiun-Lei Jerry Yu, Zhudong Township (TW); Fu-Chih Yang, Fengshan (TW); Chih-Wen Hsiung, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 14/465,250

(22) Filed: Aug. 21, 2014

(65) Prior Publication Data

US 2014/0361310 A1    Dec. 11, 2014

Related U.S. Application Data

(63) Continuation of application No. 13/403,686, filed on Feb. 23, 2012, now Pat. No. 8,860,088.

(51) Int. Cl.
| H01L 29/778 | (2006.01) |
| H01L 21/335 | (2006.01) |
| H01L 29/20 | (2006.01) |
| H01L 29/66 | (2006.01) |
| H01L 29/06 | (2006.01) |
| H01L 29/423 | (2006.01) |

(52) U.S. Cl.
CPC ........ *H01L 29/7786* (2013.01); *H01L 29/0619* (2013.01); *H01L 29/66462* (2013.01); *H01L 29/7787* (2013.01); *H01L 29/2003* (2013.01); *H01L 29/42316* (2013.01)

(58) Field of Classification Search
CPC ... H01L 29/406; H01L 29/778; H01L 29/861; H01L 29/7787; H01L 29/1066; H01L 29/2003; H01L 29/66431; H01L 29/66492; H01L 29/7781; H01L 29/7786
See application file for complete search history.

(56) References Cited

U.S. PATENT DOCUMENTS

| 5,391,899 A * | 2/1995 | Kohno ........................ 257/192 |
| 7,906,799 B2 * | 3/2011 | Sheppard ............ H01L 29/7783 257/194 |
| 2007/0018199 A1 * | 1/2007 | Sheppard .......... H01L 29/42316 257/200 |
| 2010/0025730 A1 * | 2/2010 | Heikman .............. H01L 29/402 257/194 |
| 2011/0147798 A1 * | 6/2011 | Radosavljevic ..... H01L 21/2256 257/194 |

(Continued)

FOREIGN PATENT DOCUMENTS

CN    102171830    8/2011

*Primary Examiner* — Matthew W Such
*Assistant Examiner* — David Spalla
(74) *Attorney, Agent, or Firm* — Haynes & Boone, LLP

(57) ABSTRACT

A semiconductor structure includes a first III-V compound layer. A second III-V compound layer is over the first III-V compound layer and is different from the first III-V compound layer in composition. A carrier channel is located at an interface of the first III-V compound layer and the second III-V compound layer. A dielectric cap layer is over the second III-V compound layer and a protection layer is over the dielectric cap layer. Slanted field plates are in a combined opening in the dielectric cap layer and protection layer.

20 Claims, 5 Drawing Sheets

(56) References Cited

U.S. PATENT DOCUMENTS

| | | | |
|---|---|---|---|
| 2012/0223319 A1* | 9/2012 | Dora | 257/76 |
| 2012/0235160 A1 | 9/2012 | Heikman et al. | |
| 2013/0087804 A1 | 4/2013 | Yao et al. | |
| 2013/0105817 A1* | 5/2013 | Saunier | 257/77 |

* cited by examiner

US 9,425,300 B2

SEMICONDUCTOR STRUCTURE AND METHOD OF FORMING THE SAME

PRIORITY CLAIM

The present application is a continuation of U.S. application Ser. No. 13/403,686, filed Feb. 23, 2012, which is incorporated herein by reference in its entirety.

TECHNICAL FIELD

The disclosure relates generally to a semiconductor structure and, more particularly, to a high electron mobility transistor (HEMT) and method of forming a high electron mobility transistor.

BACKGROUND

In semiconductor technology, due to their characteristics, Group III-Group V (or III-V) semiconductor compounds are used to form various integrated circuit devices, such as high power field-effect transistors, high frequency transistors, or high electron mobility transistors (HEMTs). A HEMT is a field effect transistor incorporating a junction between two materials with different band gaps (i.e., a heterojunction) as the channel instead of a doped region, as is generally the case for metal oxide semiconductor field effect transistors (MOSFETs). In contrast with MOSFETs, HEMTs have a number of attractive properties including high electron mobility and the ability to transmit signals at high frequencies, etc.

From an application point of view, enhancement-mode (E-mode) HEMTs have many advantages. E-mode HEMTs allow elimination of negative-polarity voltage supply, and, therefore, reduction of the circuit complexity and cost. Despite the attractive properties noted above, a number of challenges exist in connection with developing III-V semiconductor compound-based devices. Various techniques directed at configurations and materials of these III-V semiconductor compounds have been implemented to try and further improve transistor device performance.

BRIEF DESCRIPTION OF THE DRAWINGS

Aspects of the present disclosure are best understood from the following detailed description and the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The making and using of illustrative embodiments are discussed in detail below. It should be appreciated, however, that the disclosure provides many applicable inventive concepts that can be embodied in a wide variety of specific contexts. The specific embodiments discussed are merely illustrative and do not limit the scope of the disclosure.

A plurality of semiconductor chip regions is marked on the substrate by scribe lines between the chip regions. The substrate will go through a variety of cleaning, layering, patterning, etching and doping steps to form integrated circuits. The term "substrate" herein generally refers to the bulk substrate on which various layers and device structures may be formed. In some embodiments, the bulk substrate includes silicon or a compound semiconductor, such as GaAs, InP, Si/Ge, or SiC. Examples of such layers include dielectric layers, doped layers, polysilicon layers or conductive layers. Examples of device structures include transistors, resistors, and/or capacitors, which may be interconnected through an interconnect layer to additional integrated circuits.

Figure 1A:
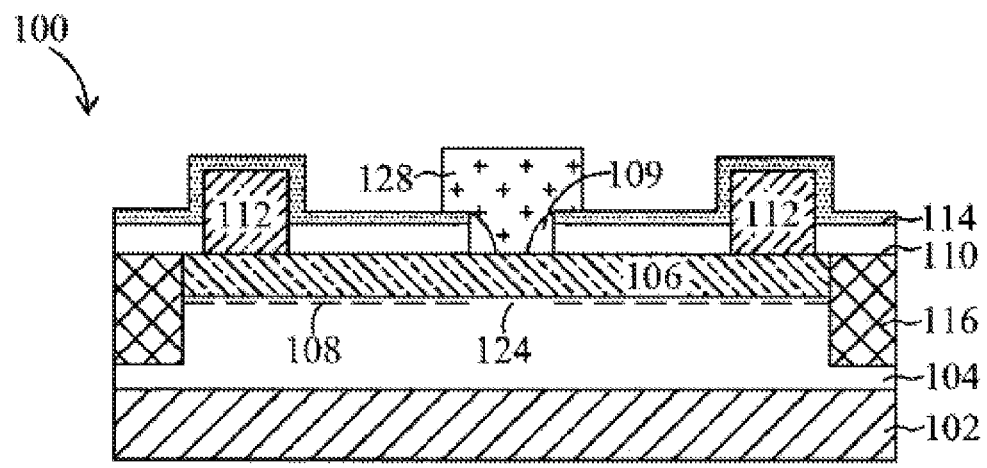
FIG. 1A is a cross-sectional view of a semiconductor structure having a high electron mobility transistor (HEMT) according to one or more embodiments of this disclosure.
Figure 1B:
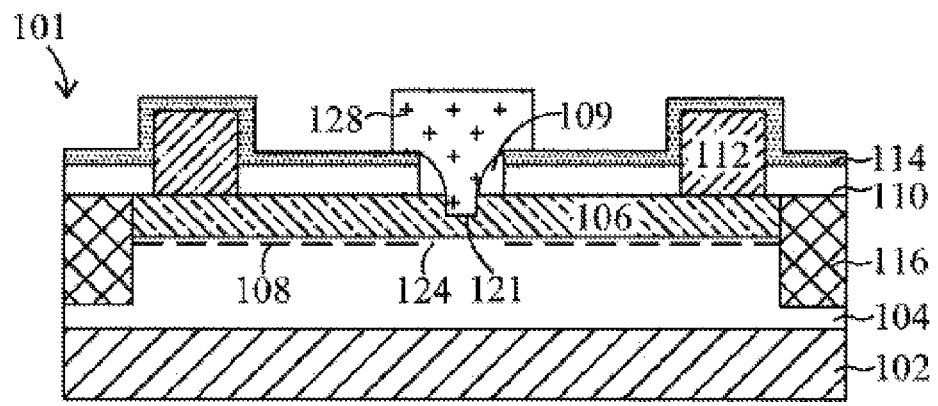
FIG. 1B is a cross-sectional view of a semiconductor structure having a HEMT according to another embodiment of this disclosure.

FIGS. 1A and 1B are cross-sectional views of semiconductor structures 100 and 101, each semiconductor structure having a high electron mobility transistor (HEMT) according to one or more embodiments of this disclosure.

Referring to FIG. 1A, the semiconductor structure 100 having a HEMT is illustrated. The semiconductor structure 100 includes a substrate 102. In some embodiments, the substrate 102 includes a silicon carbide (SiC) substrate, sapphire substrate or a silicon substrate.

The semiconductor structure 100 also includes a heterojunction formed between two different semiconductor material layers, such as material layers with different band gaps. For example, the semiconductor structure 100 includes a non-doped narrow-band gap channel layer and a wide-band gap n-type donor-supply layer. In at least one embodiment, the semiconductor structure 100 includes a first III-V compound layer (or referred to as a channel layer) 104 formed on the substrate 102 and a second III-V compound layer (or referred to as a donor-supply layer) 106 formed on the channel layer 104. The channel layer 104 and the donor-supply layer 106 are compounds made from the III-V groups in the periodic table of elements. However, the channel layer 104 and the donor-supply layer 106 are different from each other in composition. In at least one embodiment, the channel layer 104 is undoped or unintentionally doped (UID). In the present example of the semiconductor structure 100, the channel layer 104 includes a gallium nitride (GaN) layer (also referred to as the GaN layer 104). The donor-supply layer 106 includes an aluminum gallium nitride (AlGaN) layer (also referred to as AlGaN layer 106). The GaN layer 104 and AlGaN layer 106 directly contact each other. In another example, the channel layer 104 includes a GaAs layer or InP layer. The donor-supply layer 106 includes an AlGaAs layer or an AlInP layer.

In some embodiments, the GaN layer 104 is undoped. In some alternative embodiments, the GaN layer 104 is unintentionally doped, such as lightly doped with n-type dopants due to a precursor used to form the GaN layer 104. In one example, the GaN layer 104 has a thickness in a range from about 0.5 micron to about 10 microns.

In some embodiments, the AlGaN layer 106 is intentionally doped. In one example, the AlGaN layer 106 has a thickness in a range from about 5 nanometers (nm) to about 50 nanometers. In at least one embodiment, the AlGaN layer 106 comprises $Al_xGa_{1-x}N$, where x ranges from about 0.15% to about 100%.

The band gap discontinuity exists between the AlGaN layer 106 and the GaN layer 104. The electrons from a piezo-electric effect in the AlGaN layer 106 drop into the GaN layer 104, creating a very thin layer 108 of highly mobile conducting electrons in the GaN layer 104. This thin layer 108 is referred to as a two-dimensional electron gas (2-DEG), forming a carrier channel (also referred to as the carrier channel 108). The thin layer 108 of 2-DEG is located at an interface of the AlGaN layer 106 and the GaN layer 104. Thus, the carrier channel has high electron mobility because the GaN layer 104 is undoped or unintentionally doped, and the electrons can move freely without collision with the impurities or substantially reduced collisions.

The semiconductor structure 100 also includes a source feature and a drain feature disposed on the AlGaN layer 106 and configured to electrically connect to the carrier channel 108. Each of the source feature and the drain feature comprises a metal feature 112. In one example, the metal feature 112 is free of Au and comprises Al, Ti, Ni or Cu.

The semiconductor structure 100 further includes a dielectric cap layer 110 disposed on a top surface of the AlGaN layer 106 not occupied by the metal features 112. The dielectric cap layer 110 further includes an opening that exposes a portion of the AlGaN layer 106 for the gate electrode formation. The dielectric cap layer 110 protects the underlying AlGaN layer 106 from damage in the following process where plasma is used.

A protection layer 114 is disposed on top surfaces of the metal features 112 and the dielectric cap layer 110. The protection layer 114 further includes an opening that aligns with the opening in the dielectric cap layer 110. The combined opening of the opening in the protection layer 114 and the opening in the dielectric cap layer 110 exposes the portion of the AlGaN layer 106 for the gate electrode formation.

The semiconductor structure 100 further includes two slanted field plates 109 being disposed on the two side walls of the combined opening of the opening in the protection layer 114 and the opening in the dielectric cap layer 110. In some embodiments, these slanted field plates 109 can be made from HI—K materials such as $Al_2O_3$, $Ta_2O_5$, $TiO_2$, $ZnO_2$, $HfO_2$, or the alike.

The semiconductor structure 100 also includes a gate electrode 128 disposed over the combined opening on AlGaN layer 106 between the source and drain features. The gate electrode 128 includes a conductive material layer configured for voltage bias and electrical coupling with the carrier channel 108. In various examples, the conductive material layer may include a refractory metal or its compounds, e.g., titanium (Ti), titanium nitride (TiN), titanium tungsten (TiW), tungsten nitride (WN), Copper (Cu) and tungsten (W). In this embodiment, the gate electrode 128 is disposed over the portions of the protection layer 114, the slanted field plates 109, and the opening that exposes the AlGaN layer 106. The existence of the slanted filed plates 109 helps to reduce the electric field crowding that normally occur at the bottom edges of the gate electrode 128.

The semiconductor structure 100 also includes a depletion region 124 in the carrier channel 108 under the combined opening in the protection layer 114 and the dielectric cap layer 110. The carrier channel 108 becomes normally-off because of the depletion region 124. A positive gate voltage should be applied to turn on the carrier channel 108 of this HEMT. This HMET is also called an enhanced-mode HEMT that is different from a depletion-mode HEMT. The depletion-mode HEMT has a normally-on carrier channel and a negative gate voltage should be applied to turn off the carrier channel.

FIG. 1B is a cross-sectional view of the semiconductor structure 101 having a HEMT according to another embodiment of this disclosure. The layer stacks of the semiconductor structure 101 are similar to the semiconductor structure 100 shown in FIG. 1A. However, in this particular embodiment, unlike the embodiment depicted in FIG. 1A, the portion of the AlGaN layer 106 between the two slanted field plates 109 is further at least partially removed, to form a trench in the AlGaN layer 106, so that some of the gate electrode material 128 reaches a level below the surface of the AlGaN layer 106. In this structure 101, because a portion of the gate electrode 128 goes into the AlGaN layer 106, it enhances the transfer of electrons between the source and drain regions.

In the above described embodiments, the gate electrode 128, the source/drain features, and the carrier channel 108 in the GaN layer 104 are configured as a transistor. When a voltage is applied to the gate stack, a device current of the transistor could be modulated.

Figure 2:
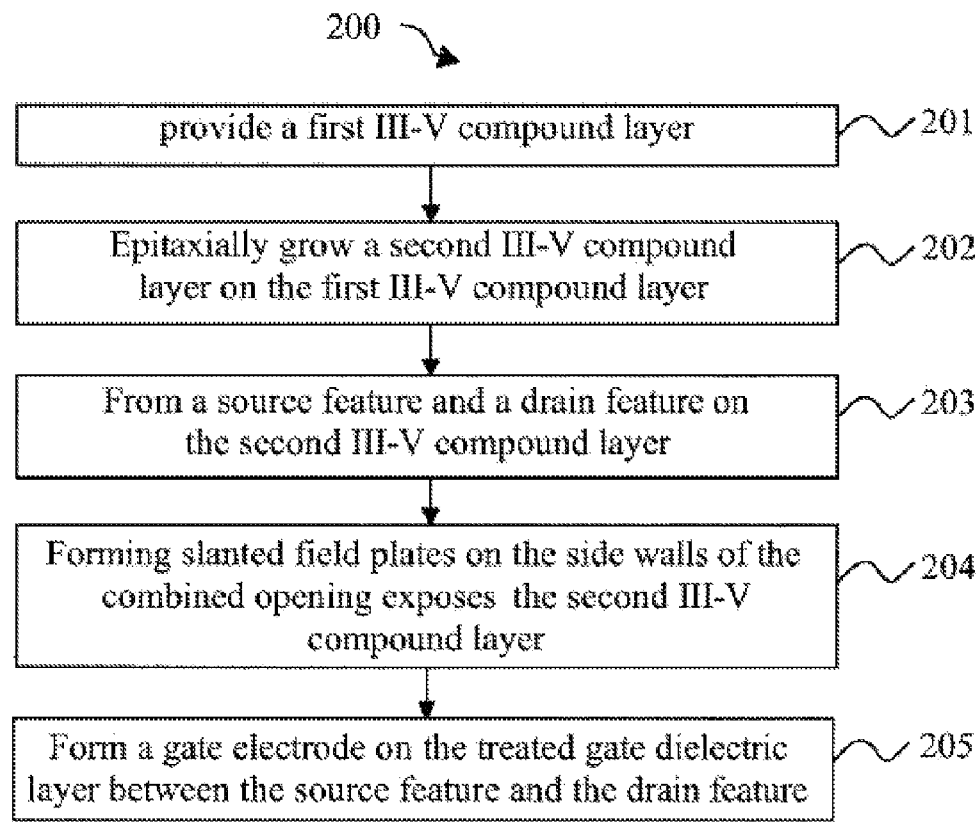
FIG. 2 is a flowchart of a method of forming a semiconductor structure having a HEMT according to one or more embodiments of this disclosure.

FIG. 2 is a flowchart of a method 200 of forming a semiconductor structure having a HEMT according to one or more embodiments of this disclosure. Referring now to FIG. 2, the flowchart of the method 200, at operation 201, a first III-V compound layer is provided. The first III-V compound layer is formed on a substrate. Next, the method 200 continues with operation 202 in which a second III-V compound layer is epitaxially grown on the first III-V compound layer. The method 200 continues with operation 203 in which a source feature and a drain feature are formed on the second III-V compound layer. The method 200 continues with operation 204 in which the slanted field plates 109 are formed on the two side walls of the combined opening that exposes the second III-V compound layer. The method 200 continues with operation 205 in which a gate electrode is formed over the portion of the second III-V compound layer between the source feature and the drain feature. It should be noted that additional processes may be provided before, during, or after the method 200 of FIG. 2.

FIGS. 3 to 8 are cross-sectional views of the semiconductor structure 100 having a HEMT at various stages of manufacture according to various embodiments of the method 200 of FIG. 2. Various figures have been simplified for a better understanding of the inventive concepts of the present disclosure.

Figure 3:
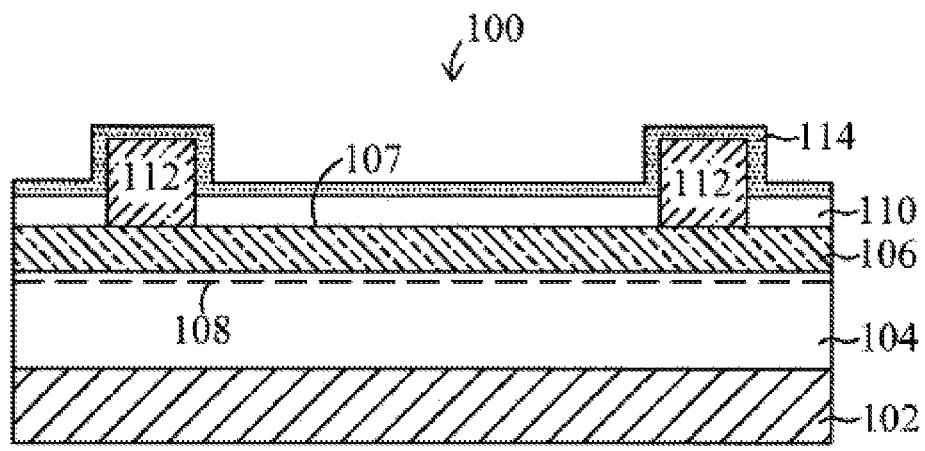
FIGS. 3 to 8 are cross-sectional views of a semiconductor structure having a HEMT at various stages of manufacture according to one embodiment of the method of FIG. 2.

Referring to FIG. 3, which is an enlarged cross-sectional view of a portion of a substrate 102 of a semiconductor structure 100 after performing operations 201, 202 and 203. In some embodiments, the substrate 102 includes a silicon carbide (SiC) substrate, sapphire substrate or a silicon substrate. A first III-V compound layer 104, also refer to as a channel layer, is grown on the substrate 102. In this embodiment, the first III-V compound layer 104 refers to a gallium nitride (GaN) layer (also referred to as the GaN layer 104). The GaN layer 114 can be epitaxially grown by metal organic vapor phase epitaxy (MOVPE) using gallium-containing precursor and nitrogen-containing precursor. The gallium-containing precursor includes trimethylgallium (TMG), triethylgallium (TEG), or other suitable chemical. The nitrogen-containing precursor includes ammonia ($NH_3$), tertiarybutylamine (TBAm), phenyl hydrazine, or other suitable chemical. The GaN layer 104 has a thickness in a range from about 0.5 micron to about 10 microns. In other embodiments, the first III-V compound layer 104 may include a GaAs layer or InP layer.

A second III-V compound layer 106, also refer to as donor-supply layer, is grown on first III-V compound layer 104. An interface is defined between the first III-V compound layer 104 and the second III-V compound layer 106. A carrier channel 108 of 2-DEG is located at the interface. In at least one embodiment, the second III-V compound layer 106 refers to an aluminum gallium nitride (AlGaN) layer (also referred to as the AlGaN layer 106). The AlGaN layer 106 can be epitaxially grown on the GaN layer 104 by MOVPE using aluminum-containing precursor, gallium-containing precursor, and nitrogen-containing precursor. The aluminum-containing precursor includes trimethylaluminum (TMA), triethylaluminium (TEA), or other suitable chemical. The gallium-containing precursor includes TMG, TEG, or other suitable chemical. The nitrogen-containing precursor includes ammonia, TBAm, phenyl hydrazine, or other suitable chemical. The AlGaN layer 106 has a thickness in a range from about 5 nanometers to about 50 nanometers. In some embodiments, the second III-V compound layer 106 may include an AlGaAs layer, or AlInP layer.

A dielectric cap layer 110 is deposited on a top surface 107 of the second III-V compound layer 106. The dielectric cap layer 110 has a thickness in a range from about 100 Å to about 5000 Å. The dielectric cap layer 110 may include $SiO_2$ or $Si_3N_4$. In one example, the dielectric cap layer 110 is $Si_3N_4$ and formed by performing a low pressure chemical vapor deposition (LPCVD) method without plasma using $SiH_4$ and $NH_3$ gases. An operation temperature is in a range of from about 650° C. to about 800° C. An operation pressure is in a range of from about 0.1 Torr to about 1 Torr. The dielectric cap layer 110 may protect the underlying second III-V compound layer 106 from damage in the following process where plasma is used. Two openings in the dielectric cap layer 110 are defined by lithography and etching processes to expose a portion of the second III-V compound layer 106.

A metal layer is deposited over the dielectric cap layer 110, overfills the openings and contacts the second III-V compound layer 106. A photoresist layer (not shown) is formed over the metal layer and developed to form a feature over the openings. The metal layer not covered by the feature of the photoresist layer is removed by a reactive ion etch (RIE) process that etches the exposed portions of the metal layer down to the underlying the dielectric cap layer 110. Metal features 112 are generated after the etching process. The metal features 112 are configured as the source feature or the drain feature for the HEMT. The photoresist layer is removed after the formation of the metal features 112. The dielectric cap layer 110 protects the underlying the second III-V compound layer 106 from damage during the etching process to form metal features 112. The carriers in carrier channel 108 of 2-DEG underlying the second III-V compound layer 106 would not be affected. The electrical performances of the semiconductor structure 101 would be positively affected. Therefore, the yield of the overall assembly could increase.

The metal layer of the metal features 112 may include one or more conductive materials. In at least one example, the metal layer is free of gold (Au) and comprises titanium (Ti), titanium nitride (TiN), or aluminum copper (AlCu) alloy. In another example, the metal layer includes a bottom Ti/TiN layer, an AlCu layer overlying the bottom Ti/TiN layer, and a top Ti layer overlying the AlCu layer. The formation methods of the metal layer include atomic layer deposition (ALD) or physical vapor deposition (PVD) processes. Without using Au in the metal features 112, the method 200 could also be implemented in the production line of integrated circuits on silicon substrate. The contamination concern from Au on the silicon fabrication process could be eliminated.

Next, a protection layer 114 is deposited on top surfaces of the metal features 112 and the dielectric cap layer 110. The protection layer 114 may include dielectric materials such as $SiO_2$ or $Si_3N_4$. In one example, the protection layer 114 is $Si_3N_4$ and formed by performing a plasma enhanced chemical vapor deposition (PECVD) method.

Figure 4:
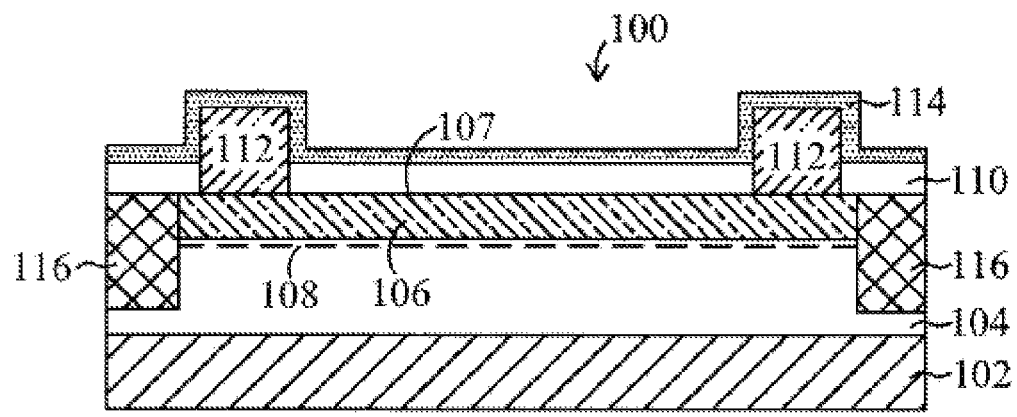

FIG. 4 illustrates the structure 100 after forming an isolation region 116 in the first III-V compound layer 104 and the second III-V compound layer 106. The isolation region 116 isolates the HEMT in the structure 100 from other devices in the substrate 102. In one example, the isolation region 116 is formed by implantation process with species of oxygen or nitrogen. The protection layer 114 protects the source feature and the drain feature from exposed during an anneal process after the implantation process.

Figure 5:
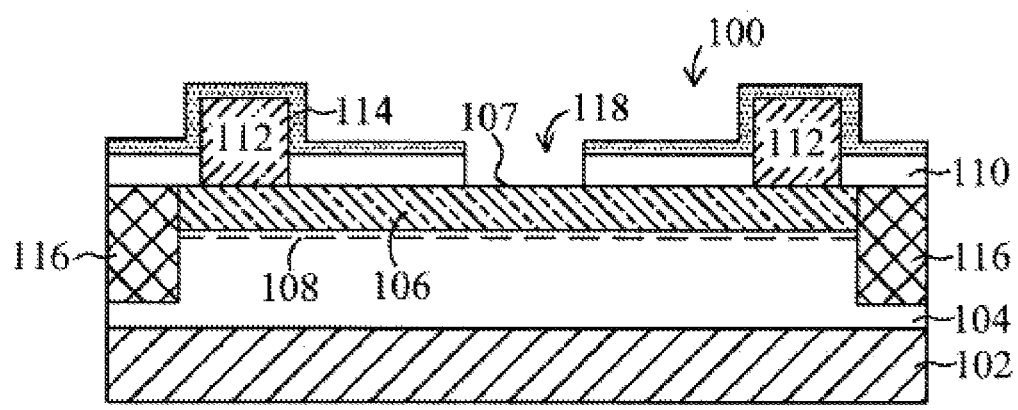

FIG. 5 illustrates the structure 100 after forming an opening 118 in the protection layer 114 and the dielectric cap layer 110. A patterned mask layer (not shown) is formed on a top surface of the protection layer 114 and an etching process is performed to remove a portion of the protection layer 114 and the dielectric cap layer 110. The opening 118 exposes a portion of the top surface 107 of the second III-V compound layer 106. The opening 118 is configured as a location for the later gate electrode formation.

Figure 6:
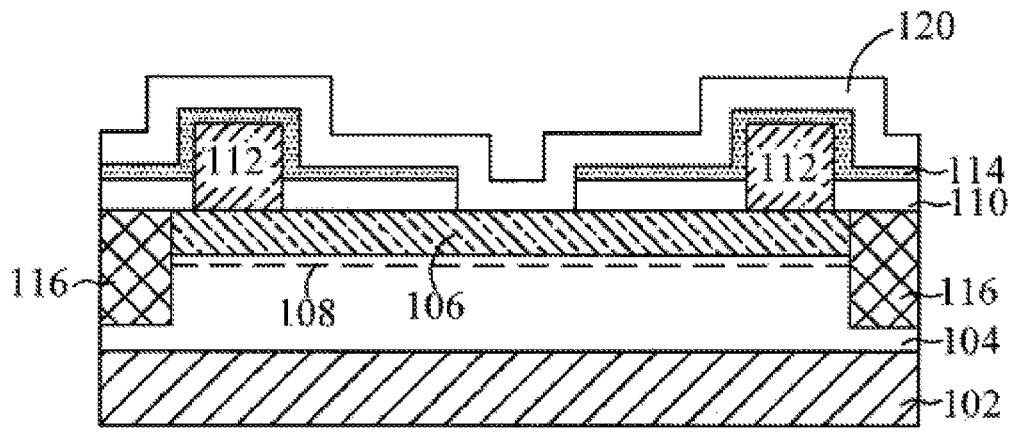

FIG. 6 illustrates how the two slanted field plates 109 are deposited onto the two sides of the opening 118. To form the slanted field plates 109, a layer of the material 120 that intends to be used to form the slanted field plates 109 is first disposed over the opening 118. In at least one embodiment, the thickness of this layer 120 is equal to the sum of the thicknesses of the protection layer 114 and the dielectric cap layer 110. In some embodiments, after this deposition step, the layer 120 fills the entire opening 118.

Figure 7:
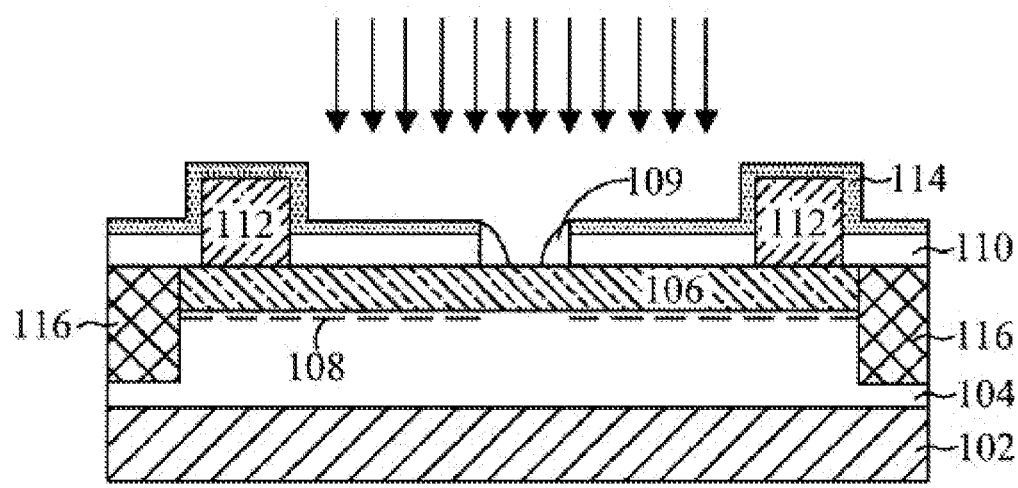

Next, as depicted in FIG. 7, a removal process, such as dry etching, is performed to remove portions of the layer 120. In particular, the etching process starts by removing the entire layer 120, both above the protection layer 114 and inside the opening 118. The removal process, i.e., the etching process, continues until it reaches the protection layer 114. Therefore, the protection layer 114 essentially acts as an etch-stop layer. As a result of stopping the removal process at the protection layer 114, all of the portions of layer 120 atop the protection layer 114 and outside the opening 118 have been removed. Because some portions of layer 120 in the opening 118 are below the protection layer 114, when the etching process stops, some portions of the layer 120 still remain in the opening 118. These remaining portions of the layer 120 in the opening 118 will form two triangularly shaped plates on the sidewalls of the opening 118. These two triangularly shaped plates became the slanted field plates 109.

In accordance with another embodiment of the present disclosure as depicted in FIG. 1B, the semiconductor structure is essentially the same as the structure 100 in the previous embodiment discussed above, except in this embodiment, after the slanted field plates 109 have been formed in the opening 118, an additional etching step is conducted to remove some of the exposed AlGaN layer 106. This additional etching step forms a trench 121 in the AlGaN layer 106, below the original surface of the AlGaN layer 106.

Figure 8:
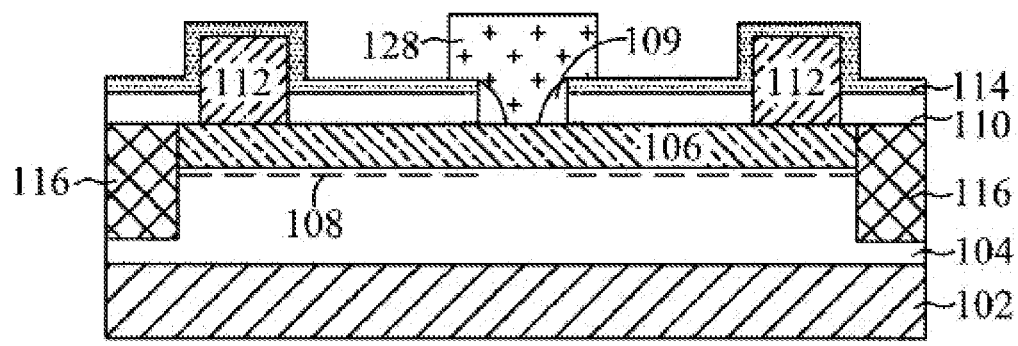

FIG. 8 illustrates the structure 100 after performing operation 205, which forms a gate electrode 128 over the portion of the second III-V compound layer 106 above the depletion region 124. In one example, the gate electrode 128 is formed over portions of the protection layer 114, and covers the entire opening 118, including the two slanted field plates 109. The electrons in the depletion region 124 of the carrier channel 108 are depleted during the deposition process in operation 204. In this example, a gate electrode layer is deposited and overfills the opening 118 shown in FIG. 7. Lithography and etching processes are performed on the gate electrode layer to define the gate electrode 128 between the source and drain features. The gate electrode 128 includes a conductive material layer that may include a refractory metal or its compounds, e.g., titanium (Ti), titanium nitride (TiN), titanium tungsten (TiW), tungsten nitride (WN) and tungsten (W). In another example, the gate electrode 128 may include nickel (Ni), gold (Au) or copper (Cu).

Note that in all of the above embodiments, the structure 100 having a HEMT can be formed through the processes illustrated in FIGS. 3 to 8 and the related text. The processes for forming the structure 101 having a HEMT are similar to the forming of the structure 100 except that, after the formation of the slanted field plates 109 on the sidewalls of the opening 118, the portion of the AlGaN layer 106 that is exposed is further etched to form a trench. In FIG. 8, depositing the gate electrode material 128 into the opening fills the entire opening 118 and the trench. As such a structure 101 having an enhanced-mode HEMT is formed.

Various embodiments of the present invention may be used to improve the performance of a semiconductor structure having a high electron mobility transistor (HEMT). For example, in conventional methods, a portion of the second III-V compound layer is etched to form a recess for an enhanced-mode HEMT. During etching the recess, the etching uniformity among the semiconductor chip regions on the same substrate is hard to control. The electrical performances of each HEMT in the same semiconductor chip region or the same substrate could not be accurately controlled. In some embodiments, the metal feature 112 is free of Au and comprises Al, Ti or Cu. Without using Au in the metal feature 112, the method 200 could also be implemented in the production line of integrated circuits on silicon substrate. The contamination concern from Au on the silicon-Fab process could be eliminated. Compared with the HEMT with Au in source/drain feature, the cost for manufacturing the HEMT according to the present application is reduced. Both the III-V semiconductor compounds process and the silicon-Fab process can be implemented in the same production line. It increases the flexibility to allocate different products for the production line.

In accordance with some embodiments, a semiconductor structure includes a first III-V compound layer. A second III-V compound layer is over the first III-V compound layer and is different from the first III-V compound layer in composition. A carrier channel is located at an interface of the first III-V compound layer and the second III-V compound layer. A dielectric cap layer is over the second III-V compound layer and a protection layer is over the dielectric cap layer. A combined opening is in the dielectric cap layer and the protection layer and slanted field plates are in the combined opening.

In accordance with some embodiments, a semiconductor structure includes a first III-V compound layer. A second III-V compound layer is over the first III-V compound layer and is different from the first III-V compound layer in composition. A carrier channel is located at an interface of the first III-V compound layer and the second III-V compound layer. A dielectric cap layer is over the second III-V compound layer and a protection layer is over the dielectric cap layer. A combined opening is in the dielectric cap layer and the protection layer and extending below a top surface of the second III-V compound layer. Slanted field plates are in the combined opening.

In accordance with some embodiments, a method of forming a semiconductor structure includes epitaxially growing a second III-V compound layer over a first III-V compound layer, wherein a carrier channel is located at an interface of the first III-V compound layer and the second III-V compound layer. The method further includes forming a dielectric cap layer over the second III-V compound layer, a protection layer over the dielectric cap layer, and a combined opening in the dielectric cap layer and the protection layer, wherein the combined opening exposes the second III-V compound layer. The method further includes forming slanted field plates in the combined opening.

Although the embodiments and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed:

1. A semiconductor structure comprising:
   a first III-V compound layer;
   a second III-V compound layer over the first III-V compound layer and different from the first III-V compound layer in composition, wherein a carrier channel is located at an interface of the first III-V compound layer and the second III-V compound layer, and wherein the second III-V compound layer is doped providing a contiguous constant composition of the second III-V compound layer;
   a dielectric cap layer over the second III-V compound layer having the contiguous constant composition;
   a protection layer over the dielectric cap layer;
   a combined opening in the dielectric cap layer and the protection layer, wherein the combined opening overlies the contiguous constant composition of the second III-V compound layer; and
   slanted field plates in the combined opening, each of the slanted field plates having a bottom surface and a sidewall, the bottom surface aligned with a top surface of the second III-V compound layer, and the sidewall is adjacent to the bottom surface, wherein an entirety of the sidewall in contact with a sidewall of the dielectric cap layer and the protection layer.

2. The semiconductor structure of claim 1, further comprising a gate electrode in the combined opening, wherein the carrier channel under the gate electrode comprises a depletion region.

3. The semiconductor structure of claim 1, wherein the slanted field plates comprise $Al_2O_3$, $Ta_2O_5$, $TiO_2$, $ZnO_2$, or $HfO_2$.

4. The semiconductor structure of claim 1, further comprising a source feature and a drain feature, wherein each of the source feature and the drain feature is over the second III-V compound layer, free of Au, and comprises Al, Ti, or Cu.

5. The semiconductor structure of claim 1, wherein the second III-V compound layer comprises AlGaN, AlGaAs, or AlInP.

6. The semiconductor structure of claim 1, further comprising a gate electrode in the combined opening, wherein the gate electrode comprises titanium (Ti), titanium nitride (TiN), titanium tungsten (TiW), tungsten (W), nickel (Ni), tungsten nitride (WN), gold (Au), or copper (Cu).

7. The semiconductor structure of claim 2, wherein the gate electrode extends below the top surface of the second III-V compound layer.

8. A semiconductor structure comprising:
  a first III-V compound layer;
  a second III-V compound layer over the first III-V compound layer and different from the first III-V compound layer in composition, wherein a carrier channel is located at an interface of the first III-V compound layer and the second III-V compound layer, and wherein the second III-V compound layer has a first composition;
  a dielectric cap layer over the second III-V compound layer, wherein the dielectric layer interfaces the first composition;
  a protection layer over the dielectric cap layer;
  a combined opening in the dielectric cap layer and the protection layer and extending below a top surface of the second III-V compound layer, an entirety of the combined opening being above the carrier channel;
  slanted field plates in the combined opening, wherein the slanted field plates interface the first composition; and
  a first metal feature and a second metal feature formed in a first and second opening in the dielectric cap layer, wherein the combined opening interposes the first and second metal features, and wherein the protection layer is formed interfacing the first and second metal features in the first and second openings.

9. The semiconductor structure of claim 8, further comprising a gate electrode in the combined opening, wherein the carrier channel under the gate electrode comprises a depletion region.

10. The semiconductor structure of claim 8, wherein the slanted field plates comprise $Al_2O_3$, $Ta_2O_5$, $TiO_2$, $ZnO_2$, or $HfO_2$.

11. The semiconductor structure of claim 8, wherein each of the slanted field plates is positioned on a sidewall of the combined opening.

12. The semiconductor structure of claim 8, wherein each of the first metal feature and the second metal feature is free of Au and comprises Al, Ti, or Cu.

13. The semiconductor structure of claim 8, wherein the first composition of the second III-V compound layer comprises AlGaN, AlGaAs, or AlInP.

14. The semiconductor structure of claim 8, further comprising a gate electrode in the combined opening, wherein the gate electrode comprises titanium (Ti), titanium nitride (TiN), titanium tungsten (TiW), tungsten (W), nickel (Ni), tungsten nitride (WN), gold (Au), or copper (Cu).

15. A method of forming a semiconductor structure, the method comprising:
  epitaxially growing a second III-V compound layer over a first III-V compound layer, wherein a carrier channel is located at an interface of the first III-V compound layer and the second III-V compound layer;
  forming a dielectric cap layer over the second III-V compound layer;
  forming a protection layer over the dielectric cap layer;
  forming a first metal feature and a second metal feature on the second III-V compound layer, wherein the forming includes forming the first and second metal features in first and second openings of the dielectric cap layer respectively;
  after forming the first metal feature and the second metal feature in the first and second openings, forming a combined opening in the dielectric cap layer and the protection layer, wherein the combined opening exposes the second III-V compound layer; and
  forming slanted field plates in the combined opening, each of the slanted field plates being formed with a bottom surface and a sidewall, the bottom surface aligned with a top surface of the second III-V compound layer, and the sidewall is adjacent to the bottom surface, wherein an entirety of the sidewall is in contact with the dielectric cap layer and the protection layer.

16. The method of claim 15, wherein forming slanted field plates in the combined opening comprises depositing a material layer to a thickness equal to a sum of a thickness of the dielectric cap layer and a thickness of the protection layer.

17. The method of claim 15, wherein forming slanted field plates in the combined opening comprises:
  forming a material layer in the combined opening and over the protection layer; and
  applying a removal process to the material layer until all of portions of the material layer above the protection layer have been removed.

18. The method of claim 15, further comprising etching the second III-V compound layer to form a trench between the slanted field plates.

19. The method of claim 15, further comprising forming a gate electrode in the combined opening.

20. The method of claim 19, wherein forming the gate electrode in the combined opening further comprises forming the gate electrode over the protection layer.

* * * * *